(12) United States Patent
Ansell et al.

(10) Patent No.: US 10,872,775 B2
(45) Date of Patent: Dec. 22, 2020

(54) METHODS OF PLASMA ETCHING AND PLASMA DICING

(71) Applicant: SPTS TECHNOLOGIES LIMITED, Newport (GB)

(72) Inventors: Oliver J Ansell, Bristol Avon (GB); Martin Hanicinec, Newport (GB); Janet Hopkins, Powys (GB)

(73) Assignee: SPTS Technologies Limited, Newport (GB)

(*) Notice: Subject to any disclaimer, the term of this patent is extended or adjusted under 35 U.S.C. 154(b) by 175 days.

(21) Appl. No.: 15/995,184

(22) Filed: Jun. 1, 2018

(65) Prior Publication Data
US 2018/0350615 A1    Dec. 6, 2018

(30) Foreign Application Priority Data
Jun. 5, 2017 (GB) .................................. 1708927.7

(51) Int. Cl.
*H01L 21/3065* (2006.01)
*H01L 21/78* (2006.01)
*H01L 21/683* (2006.01)

(52) U.S. Cl.
CPC .... *H01L 21/30655* (2013.01); *H01L 21/6836* (2013.01); *H01L 21/78* (2013.01)

(58) Field of Classification Search
CPC .......................... H01L 21/30655; H01L 21/78
See application file for complete search history.

(56) References Cited

U.S. PATENT DOCUMENTS

| | | | |
|---|---|---|---|
| 6,846,746 B2 | 1/2005 | Rattner et al. | |
| 8,450,188 B1 | 5/2013 | Lindsey, Jr. | |
| 8,906,745 B1 | 12/2014 | Lindsey, Jr. et al. | |
| 8,980,726 B2 | 3/2015 | Lei et al. | |
| 9,153,493 B1 | 10/2015 | Lindsey, Jr. | |
| 9,484,210 B2 | 11/2016 | Burghout et al. | |
| 9,780,021 B2* | 10/2017 | Harikai | H01L 23/49811 |
| 9,911,677 B2* | 3/2018 | Mizuno | H01L 21/0212 |
| 9,922,899 B2* | 3/2018 | Harikai | H01L 21/0212 |
| 2014/0094018 A1 | 4/2014 | Falvo et al. | |
| 2017/0263502 A1* | 9/2017 | Okita | H01L 21/78 |
| 2018/0096892 A1* | 4/2018 | Sandoh | H01L 21/78 |
| 2018/0240678 A1* | 8/2018 | Itou | H01L 21/78 |

FOREIGN PATENT DOCUMENTS

| | | |
|---|---|---|
| CN | 104576506 A | 4/2015 |
| GB | 2499816 A | 9/2013 |
| WO | WO2012154764 A2 | 11/2012 |

* cited by examiner

*Primary Examiner* — Bac H Au
(74) *Attorney, Agent, or Firm* — Hodgson Russ LLP

(57) ABSTRACT

A method is for plasma etching one or more dicing lanes in a silicon substrate having a backside metal layer attached thereto. The method includes performing a main etch using a cyclical plasma etch process in which a deposition step and an etch step are alternately repeated to produce dicing lanes having scalloped sidewalls, and switching to performing a secondary etch using a cyclical plasma etch process in which a deposition step and an etch step are alternately repeated until the backside metal layer is reached. The amount of silicon removed in one etch step during the secondary etch is half or less than half of the amount of silicon removed in one etch step during the main etch.

18 Claims, 10 Drawing Sheets

METHODS OF PLASMA ETCHING AND PLASMA DICING

BACKGROUND

The present invention relates to methods of plasma etching and plasma dicing.

Semiconductor manufacture typically involves large numbers of silicon chips being processed in parallel on a single semiconductor wafer. Once the processing steps are completed, the wafer must be diced into discrete chips. Connections are then made to the chips which are subsequently packaged. Traditionally, the dicing step has been carried out using diamond saws which cut along scribe lines on the wafer. Recently, there has been much interest in providing new methods for dicing wafers. These offer the possibility of enhanced performance and lower cost. One such approach is to use lasers to carry out the dicing of the wafer. An alternative approach is to use plasma etching to dice the wafer. This has benefits in terms of minimising die edge damage, maximising the efficient use of the wafer surface by using very narrow scribe lines, and providing the option to use non-orthogonal scribe line layouts. Depending on the application requirement, the plasma etching can occur before or after thinning or grinding of the wafer.

Plasma dicing offers many benefits compared to other dicing methods such as laser or blade cutting such as less chipping, increased die strength/yield and increased die density per wafer. The wafer is typically mounted on tape in a frame arrangement and anisotropically plasma etched using the known "Bosch" process, a technique where the process gases alternate between a passivating (deposition) gas and an etching gas. By controlling the process parameters, excellent anisotropic profiles can be obtained with high etch rates. A consequence of the Bosch process is that the sidewalls have an inherent roughness referred to as scallops due to their shape.

Frequently a backside metal (BSM) layer or multiple layers of backside metals are attached to the wafer for electrical contact purposes. Some dicing technologies such as sawing or laser scribing can accommodate BSM removal along the scribe lines. However the presence of these metallic layers can be problematic in the plasma dicing of wafers because the plasma chemistry for etching the bulk silicon is not well suited to etching the backside metals. Without etching the backside metals, there is a risk of metal tearing at the die singulation step, where pieces of metal are left adhered to the base of the separated dies. A poor BSM break could cause problems in a subsequent work flow, therefore it is desirable for all the metal from the exposed lanes to stay attached to dicing tape after the BSM separation process and die lift-off.

US 2010/010227 A1 (hereinafter referred to as US '227) discloses a semiconductor die singulation method. US '227 document does not mention the problem of BSM tearing, but suggests that successful die separation can be achieved by using either a conventional anisotropic Bosch etch or largely isotropic etch steps when approaching the silicon/BSM interface. In particular, US '227 discloses increasing the width of the dicing lanes as the BSM layer is approached by forming larger and more pronounced scallops.

The object of this invention is to provide a plasma etch process that can quickly remove silicon and enable singulation to take place without detrimental tearing of the BSM.

The inventors have investigated the problem of BSM tearing and have found that there are two main parameters that influence how cleanly the BSM separates:

1. The angle between the BSM plane and the local die sidewall plane at the die/BSM interface.
2. Regularity along the die base edge.

These parameters are related to the shape of the scallop at the silicon/BSM interface. In particular, the inventors have found that the higher the angle between the BSM plane and the local die sidewall plane at the silicon/BSM interface (i.e. the closer the sidewall is to being perpendicular to the BSM plane at the interface), the cleaner the BSM separation. Therefore, large, deep, and pronounced scallops increase the risk of BSM tearing because they result in an irregular die base edge and low angles between the BSM and die side wall at the silicon/BSM interface. This is in contrast to the disclosure of US '227.

Furthermore, a phenomenon of plasma etching (and other etching processes) is that the etch rate is dependent on the aspect ratio of the etching lanes due to gas transport limitations. This is known as Aspect Ratio Dependent Etching (ARDE). In particular, the intersection of lanes and the centre of lanes are etched with different etch rates, which typically results in the intersections "touching down" (reaching the BSM layer) sooner. This results in the BSM layer intercepting the die sidewall at a different point within each scallop, thereby creating an irregular die base edge. This also results in the "etch front" area decreasing, which increases the etch rate of the last scallops, making them even more pronounced and adding to the BSM tearing problem.

SUMMARY

According to a first aspect of the invention, there is provided a method of plasma etching one or more dicing lanes in a silicon substrate having a backside metal layer attached thereto, the method comprising the steps of:

performing a main etch using a cyclical plasma etch process in which a deposition step and an etch step are alternately repeated to produce dicing lanes having scalloped sidewalls; and switching to performing a secondary plasma etch using a cyclical etch process in which a deposition step and an etch step are alternately repeated until the backside metal layer is reached;

wherein the amount of silicon removed in one etch step during the secondary etch is half or less than half of the amount of silicon removed in one etch step during the main etch.

By removing less silicon when approaching the BSM layer, the scallops formed during the secondary etch (as a result of the Bosch process) are smaller and shallower than the scallops formed during the main etch. By forming small and shallow scallops at the silicon/BSM interface, the angle between the BSM plane and the local die sidewall plane at the silicon/BSM interface is more likely to be high. Etching small and shallow scallops near the silicon/BSM interface also reduces the ARDE effect, thereby decreasing irregularities along the die base edge. Furthermore, by performing a multi-step process comprising a main etch and a secondary etch, the main etch can be carried out under a high rate to achieve a high throughput.

It is envisaged that the amount of silicon removed in an etch step during the main etch will not vary over the course of the main etch. However, in principle, the amount of silicon removed in an etch step may be variable over the course of the main etch. In those embodiments, the amount of silicon removed in one etch step during the secondary etch is understood to be expressed in relation to the mean amount of silicon removed per etch step in the main etch.

In some embodiments, the amount of silicon removed in one etch step during the secondary etch is one third or less than one third of the amount of silicon removed in one etch step during the main etch. In other embodiments, the amount of silicon removed in one etch step during the secondary etch is one quarter or less than one quarter of the amount of silicon removed in one etch step during the main etch. In other embodiments, the amount of silicon removed in one etch step during the secondary etch is one fifth or less than one fifth of the amount of silicon removed in one etch step during the main etch. In other embodiments, the amount of silicon removed in one etch step during the secondary etch is one sixth or less than one sixth of the amount of silicon removed in one etch step during the main etch.

Given that the secondary etch process removes less silicon and is therefore slower than the main etch process, a balance needs to be found between maintaining a high throughput and reducing the risk of BSM tearing. Thus, preferably, the amount of silicon removed in one etch step during the secondary etch is at least a fortieth of the amount of silicon removed in one etch step during the main etch. In some embodiments, the amount of silicon removed in one etch step during the secondary etch is at least a thirtieth of the amount of silicon removed in one etch step during the main etch. In some embodiments, the amount of silicon removed in one etch step during the secondary etch is at least a twentieth of the amount of silicon removed in one etch step during the main etch.

To a first approximation, the amount of silicon removed during an etch step is directly proportional to the etch time of the etch step if the process conditions such as RF power and gas flow are maintained at a constant value. Thus, to achieve a particular ratio of the amount of silicon removed between the main etch and the secondary etch, the same ratio of the etch times can be used.

Preferably, the etch time of one etch step during the secondary etch is half or less than half of the etch time for one etch step during the main etch. In some embodiments, the etch time of one etch step during the secondary etch is one third or less than one third of the etch time for one etch step during the main etch. In other embodiments, the etch time of one etch step during the secondary etch is one quarter or less than one quarter of the etch time for one etch step during the main etch. In other embodiments, the etch time of one etch step during the secondary etch is one fifth or less than one fifth of the etch time for one etch step during the main etch. In other embodiments, the etch time of one etch step during the secondary etch is one sixth or less than one sixth of the etch time for one etch step during the main etch.

If the etch time of one etch step during the secondary etch is lower than the etch time of one etch step during the main etch, a balance needs to be found between maintaining a high throughput and reducing the risk of BSM tearing. Thus, preferably, the etch time of one etch step during the secondary etch is at least one fortieth of the etch time of one etch step during the main etch. In some embodiments, the etch time of one etch step during the secondary etch is at least one thirtieth of the etch time of one etch step during the main etch. In some embodiments, the etch time of one etch step during the secondary etch is at least one twentieth of the etch time of one etch step during the main etch.

It is envisaged that the etch time of an etch step during the main etch will not vary over the course of the main etch. However, in principle, the etch time of an etch step may be variable over the course of the main etch. In those embodiments, the etch time of an etch step during the secondary etch is understood to be expressed in relation to the mean etch time of an etch step in the main etch.

During the switch between the main etch and the secondary etch, the amount of silicon removed during each etch step may be progressively reduced. The switch may occur over a few etch cycles, one etch cycle being defined as one deposition step and one etch step. For example, the amount of silicon being removed in one etch step as the main etch switches to the secondary etch may be progressively reduced over 2 etch cycles, 3 etch cycles, 4 etch cycles, 5 etch cycles, 6 etch cycles, 7 etch cycles, or 8 etch cycles. The progressive reduction in the amount of silicon removed during the switch may be linear.

During the switch between the main etch and the secondary etch, the etch time of each etch step may be progressively reduced. The switch may occur over a few etch cycles, one etch cycle being defined as one deposition step and one etch step. For example, the etch time of each step as the main etch switches to the secondary etch may be progressively reduced over 2 etch cycles, 3 etch cycles, 4 etch cycles, 5 etch cycles, 6 etch cycles, 7 etch cycles, or 8 etch cycles. The progressive reduction in the etch time during the switch may be linear.

Preferably, the etch time of one etch step during the secondary etch is 1.5 seconds or less. In some embodiments, the etch time of one etch step during the secondary etch is 1 second or less. In other embodiments, the etch time of one etch step during the secondary etch is 0.5 seconds or less. In other embodiments, the etch time of one etch step during the secondary etch is about 0.5 seconds.

Switching to the secondary etch may begin before the main etch reaches the backside metal layer. In some embodiments, the secondary etch begins when the main etch reaches a distance of about 60 μm or less from the backside metal layer (i.e. about 60 μm or less from the interface between the silicon and the backside metal layer). In other embodiments, the secondary etch begins when the main etch reaches a distance of about 50 μm or less from the backside metal layer. In other embodiments, the secondary etch begins when the main etch reaches a distance of about 40 μm or less from the backside metal layer. In other embodiments, the secondary etch begins when the main etch reaches a distance of about 30 μm or less from the backside metal layer. In other embodiments, the secondary etch begins when the main etch reaches a distance of about 20 μm or less from the backside metal layer.

Alternatively, in the case where a plurality if intersecting dicing lanes are to be etched, switching to the secondary etch may begin when the dicing lane intersections (i.e. the point at which dicing lanes cross over) reach the backside metal layer. This embodiment may allow a higher throughput compared to switching to the second etch before the main etch reaches the backside metal layer because the main etch process can be performed for longer before switching to the (slower) secondary etch process. Furthermore, the point at which the dicing lane intersections reach the BSM layer can be detected using known methods, thereby providing a convenient, detectable point at which the secondary etch can begin.

After performing the secondary etch, a smoothing step may be performed to reduce scalloping, wherein the smoothing step comprises exposing the sidewalls of each dicing lane to an anisotropic plasma etch which at least partially etches the scallops to provide smoothed sidewalls.

This smoothing step is a highly directional etch designed to remove sharp edges and irregularities at the silicon/BSM interface, which contribute to BSM tearing.

The main etch and/or the secondary etch may be of the type commonly known as a "Bosch etch". Exemplary references are U.S. Pat. No. 5,501,893, U.S. Pat. No. 7,648,611 and U.S. Pat. No. 8,133,349, the entire contents of which are herein incorporated by reference.

Typically, a mask is formed on the silicon substrate prior to the performance of the main etch in order to define the one or more dicing lanes.

In another aspect of the invention, there is provided a method of plasma etching one or more dicing lanes in a silicon substrate having a backside metal layer attached thereto, the method comprising the steps of:
performing a main etch using a cyclical plasma etch process in which a deposition step and an etch step are alternately repeated until the backside metal layer is reached;
performing a smoothing step reduce scalloping, wherein the smoothing step comprises exposing the sidewalls of each dicing lane to an anisotropic plasma etch which at least partially etches the scallops to provide smoothed sidewalls.

Preferably, the anisotropic plasma etch uses a plasma generated with fluorine-containing gas, e.g. $SF_6$.

The plasma may be generated in a gaseous mixture comprising the fluorine-containing gas and an inert gas, preferably argon.

The anisotropic plasma etch preferably uses a RF bias having a RF power of 500 W or more.

The anisotropic plasma etch preferably uses a plasma generated with a RF signal having a RF power of 3000 W or more.

In another aspect of the invention, there is provided a method of plasma dicing a silicon substrate having a backside metal layer attached thereto, the method comprising:
performing the method of plasma etching of any one of the earlier aspects of the invention; and
singulating the substrate into one or more dies along the dicing lanes.

Suitable methodologies for singulating a silicon substrate having etched dicing lanes and a BSM layer or layers are well known to the skilled reader.

While the invention is described above, it extends to any inventive combination of the features set out above or in the following description, drawings, or claims.

BRIEF DESCRIPTION OF THE DRAWINGS

The invention will now be described, by way of example only, with reference to the accompanying drawings, in which.

DETAILED DESCRIPTION

Figure 1A:
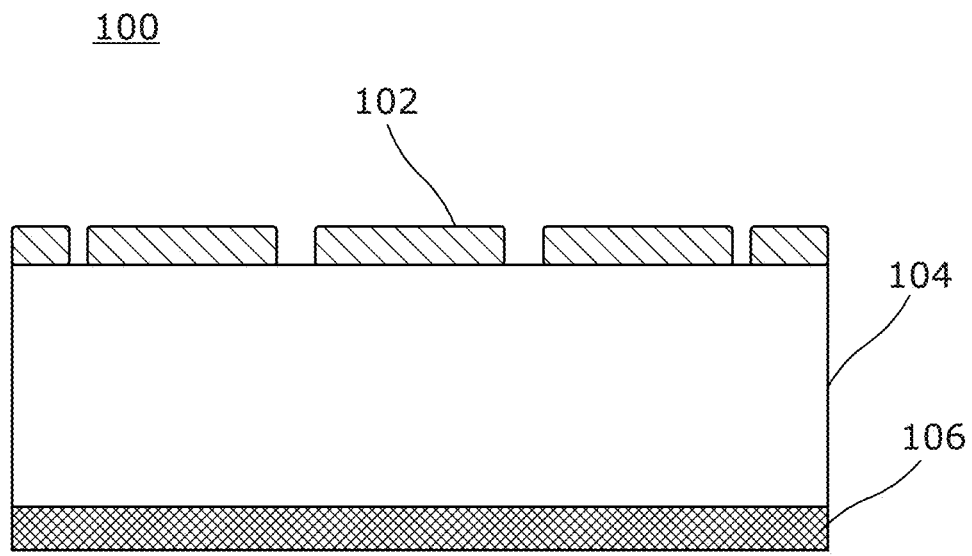
FIGS. 1(a) and 1(b) are schematic diagrams of a typical dicing process.

FIG. 1(a) shows a schematic view of a typical starting structure 100 for performing a known plasma etching process. The structure 100 comprises a patterned photoresist layer 102 overlaying one side of a silicon substrate 104. A backside metal (BSM) layer 106 is attached to the opposite side of the silicon substrate 104.

Figure 1B:
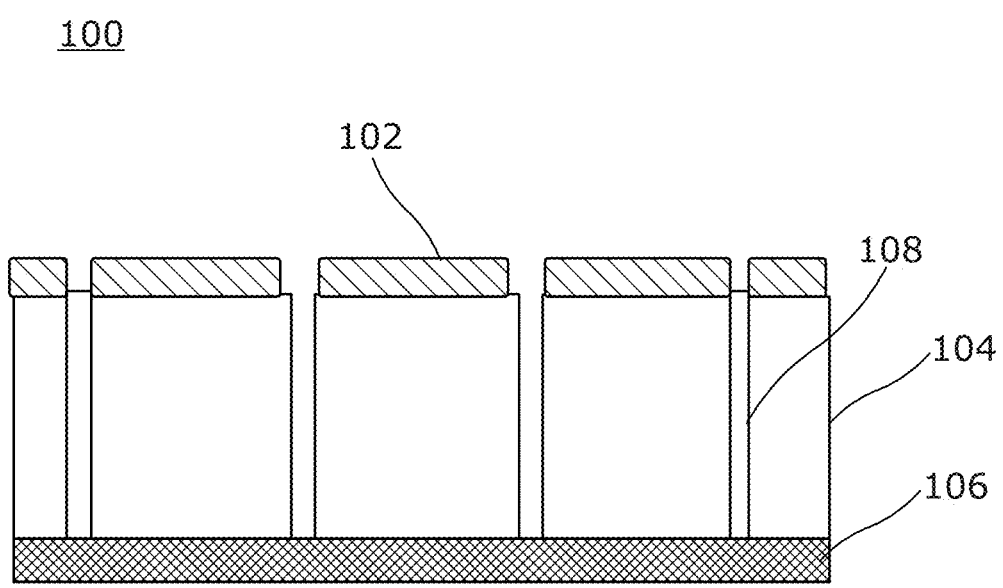

FIG. 1(b) shows a schematic view of structure 100 after performing a plasma etching process to create dicing lanes 108. The silicon substrate 104 has been etched all the way through but because the plasma chemistry is not suited to etching through the BSM layer 106, the plasma etching process stops at the BSM layer 106.

Figure 2:
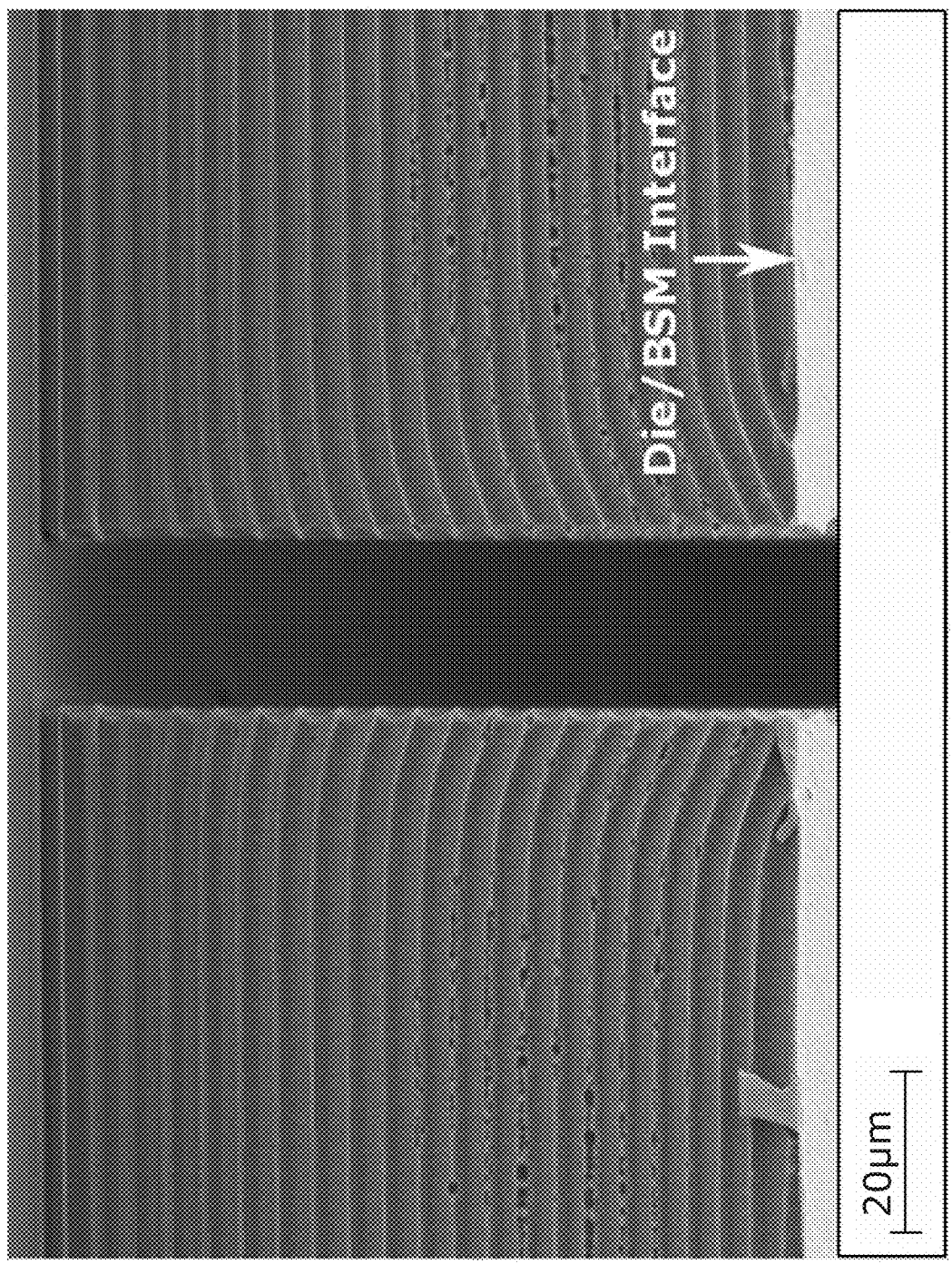
FIG. 2 is an image showing a side view of two adjacent dies 110 that have undergone etching using the Bosch process.

FIG. 2 is an SEM (scanning electron microscope) image showing a side view of two adjacent dies 110 that have undergone etching using the Bosch process and have subsequently been singulated. It can be seen that the sidewalls of each die 110 are scalloped as a result of using the Bosch process to create the dicing lanes 108. The silicon/BSM interface is indicated at the bottom of the image.

Figure 3:
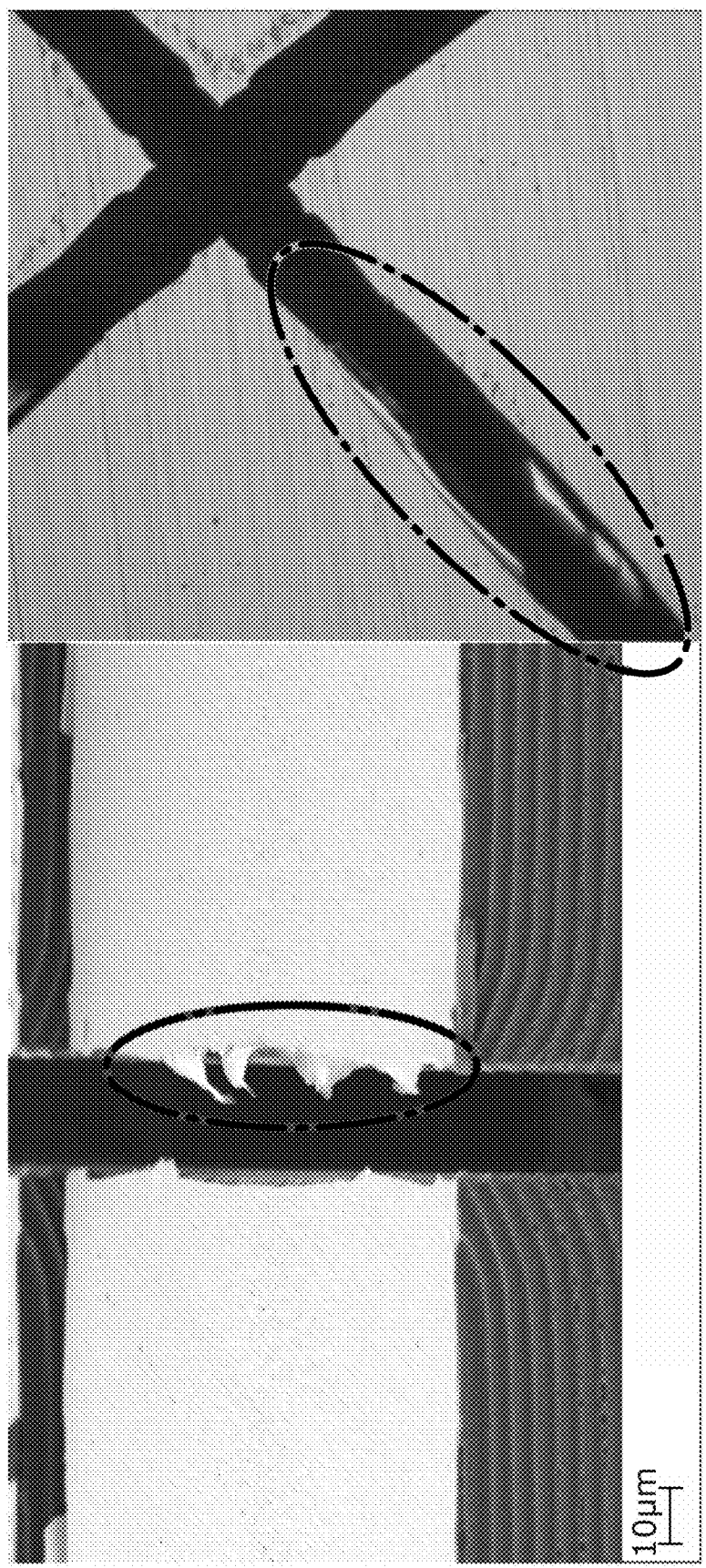
FIG. 3 is an image showing poor BSM separation between two singulated dies.

FIG. 3 shows an example of poor BSM separation between two singulated dies. In both the images of FIG. 3, the dies are orientated with the BSM layer facing upward. It can be seen that the BSM layer has not separated cleanly, with metal residues adhering to the irregular silicon/BSM interface.

Figure 4:
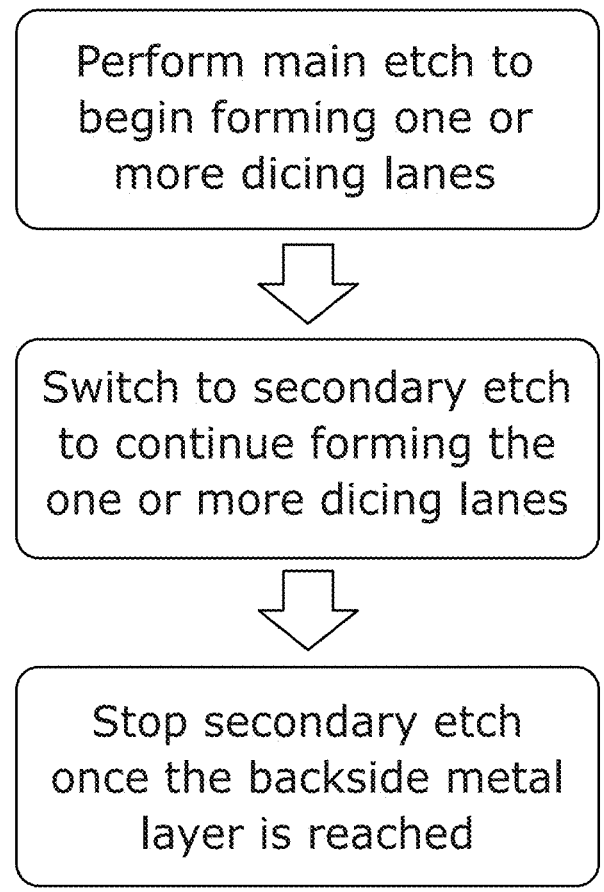
FIG. 4 shows a flow chart of a method according to a first embodiment

FIG. 4 shows a flow chart of a method according to a first embodiment. As described above and presented in FIG. 1(b) a silicon substrate 104 having a backside metal (BSM) layer 106 attached thereto is first subjected to a main etch process. The main etch is a Bosch plasma etch, i.e. comprising a deposition step and a plasma etch step which are alternately repeated to partially form dicing lanes 108 through the silicon substrate 104.

The deposition step and subsequent deposition steps in this embodiment and further embodiments may be performed using a plasma formed from a suitable source gas, such as a fluorocarbon, for example $C_4F_8$. The etch step and subsequent etch steps in this embodiment and further embodiments may be performed using a plasma formed from a suitable etching gas or gas mixture, such as a fluorine containing gas, for example $SF_6$. Example process conditions for the main etch process are indicated in Table 1.

TABLE 1

| Process parameter | Deposition | Removal | Etch |
|---|---|---|---|
| Time [s] | 1-5 | 0.5-5 | 3-10 |
| Pressure [mTorr] | 60-120 | 15-50 | 100-180 |
| RF Power [W] | 4500 | 4500 | 5200 |
| Bias Power [W] | 0 | 500-1200 | 0-100 |
| $C_4F_8$ [sccm] | 200-600 | — | — |
| $SF_6$ [sccm] | — | 200-400 | 750 |

Before the dicing lanes being formed by the main etch reach the BSM layer, the method of the first embodiment switches from performing the main etch process to performing a secondary etch process. Similar to the main etch process, the secondary etch process is also a Bosch plasma etch comprising a deposition step and a plasma etch step, which are alternately repeated to continue forming the dicing lanes 108 through the silicon substrate 104 until the BSM layer 106 is reached. The end point of the secondary etch can be estimated using known techniques, such as optical emission spectroscopy (OES) or interferometry.

One difference between the main etch and the secondary etch is that the amount of silicon removed in one etch step during the secondary etch is half or less than half of the amount of the silicon removed in one etch step during the main etch. In this way, the sidewall scallops formed during the secondary etch are smaller and shallower compared to the scallops formed by the main etch.

Figure 5:
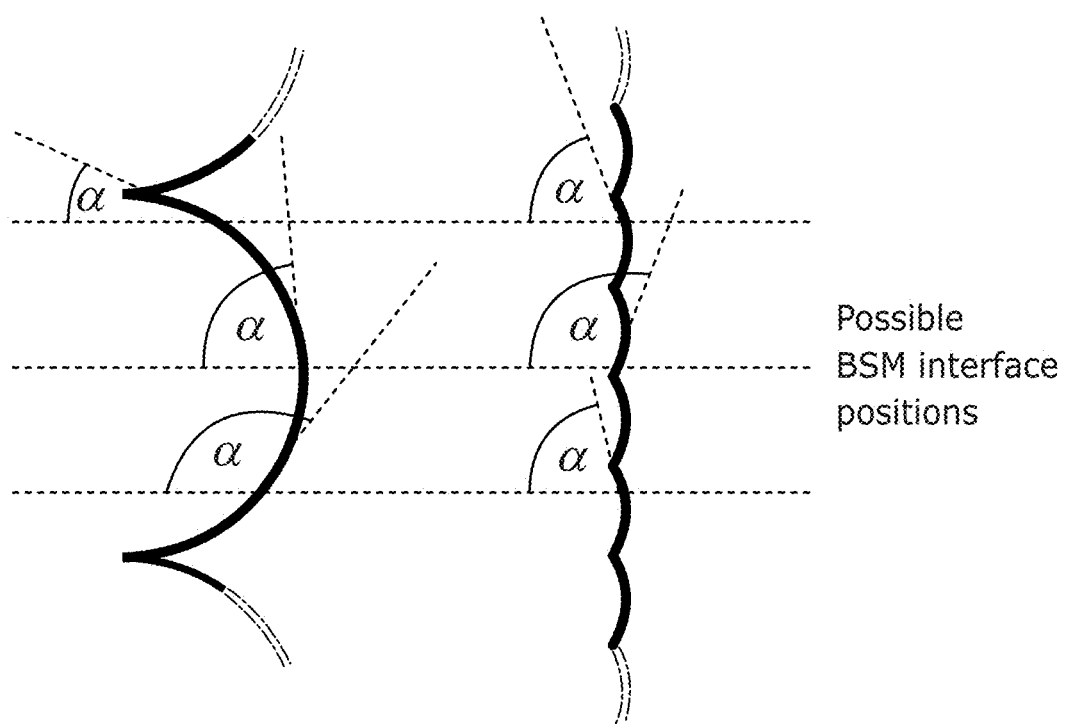
FIG. 5 is a schematic drawing showing the difference in this angle (α) between deep pronounced scallops and shallow small scallops at different possible positions for the silicon/BSM interface.

By forming small and shallow scallops at and near the silicon/BSM interface, the angle between the BSM plane and the local sidewall at the interface is more likely to be high (closer to 90°) compared to deep and pronounced scallops. FIG. 5 is a schematic drawing showing the difference in this angle ($\alpha$) between deep pronounced scallops (shown on the left) and shallow small scallops (shown on the right) at different possible positions for the silicon/BSM interface. FIG. 5 shows that with deep pronounced scallops, the angle between the BSM plane and the local side wall can be very low at certain silicon/BSM interface positions (e.g. the angle indicated at the top of the drawing).

To a first approximation, if the RF powers and gas flow rates are maintained at a constant value, the amount of silicon removed during an etch step is directly proportional to the etch time of the etch step. Thus, one way to remove less silicon during an etch step is to reduce the etch time of the etch step. For example, to reduce the amount of silicon removed in one etch step by half, the etch time of the etch step could be halved.

Figure 6:
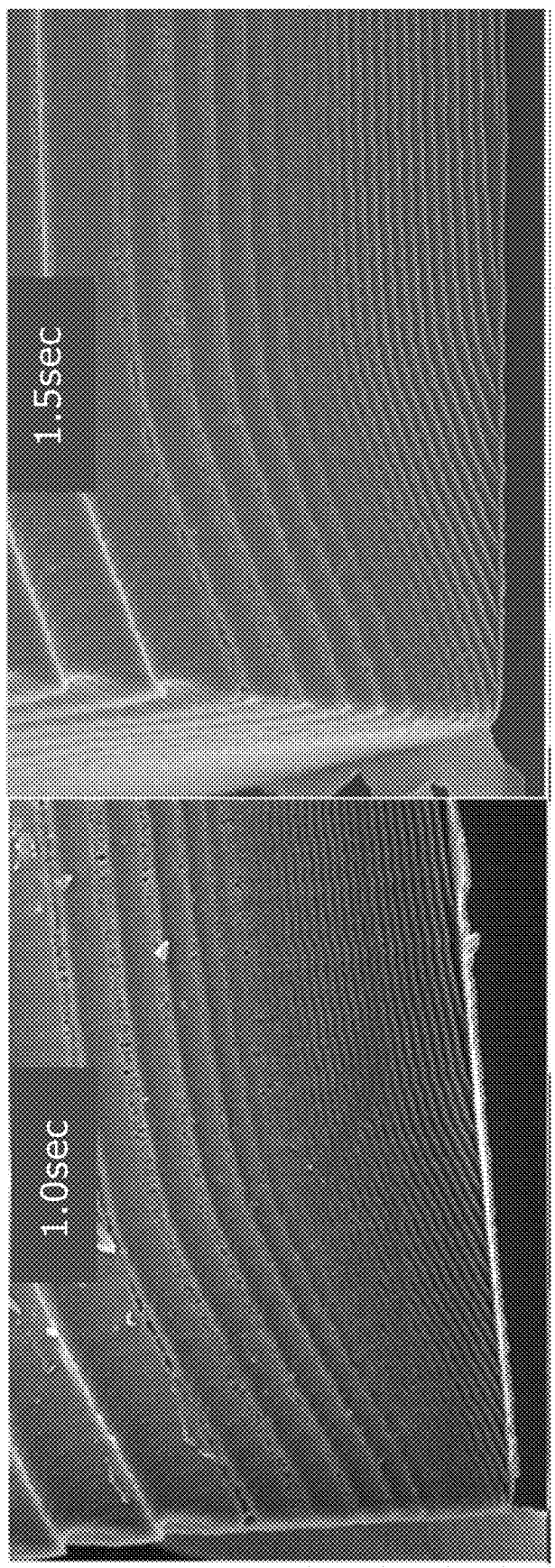
FIG. 6 shows images of the sidewall of a die for different etch times during the secondary etch.

FIG. 6 shows SEM (scanning electron microscope) images of the sidewall of a die for etch times of 1 second and 1.5 seconds for each etch step during the secondary etch. It can be seen that the scallops are smaller and shallower toward the BSM layer (located at the bottom of each image) compared to the scallops further away from the BSM layer (formed during the main etch). Preferably, the etch time of one etch step during the secondary etch is about 0.5 seconds.

As well as the etch time, other parameters can also be changed, either alone or in combination, to reduce the amount of silicon removed during an etch step. For example, the RF power could be reduced or less etching gas (e.g. $SF_6$) could be used.

The point at which the method switches from performing the main etch to performing the secondary etch requires consideration of the desire to maintain high throughput versus allowing reliable BSM separation. To maintain high throughput, the overall time spent performing the secondary etch is ideally kept to a minimum. The switching point will depend on an estimated etch rate of the main etch and either an estimated silicon substrate thickness or a known silicon substrate thickness. In practice, the switching point may be determined by a trial and error process with representative substrates.

The switch from the main etch process to the secondary etch process may be progressive, i.e. the amount of silicon removed may be progressively reduced as the method switches from the main etch process to the secondary etch process. The switch may occur over a few etch cycles (one cycle being defined as one deposition step and one etch step). The amount of silicon removed during one etch step during the switch may be reduced linearly.

Figure 7:
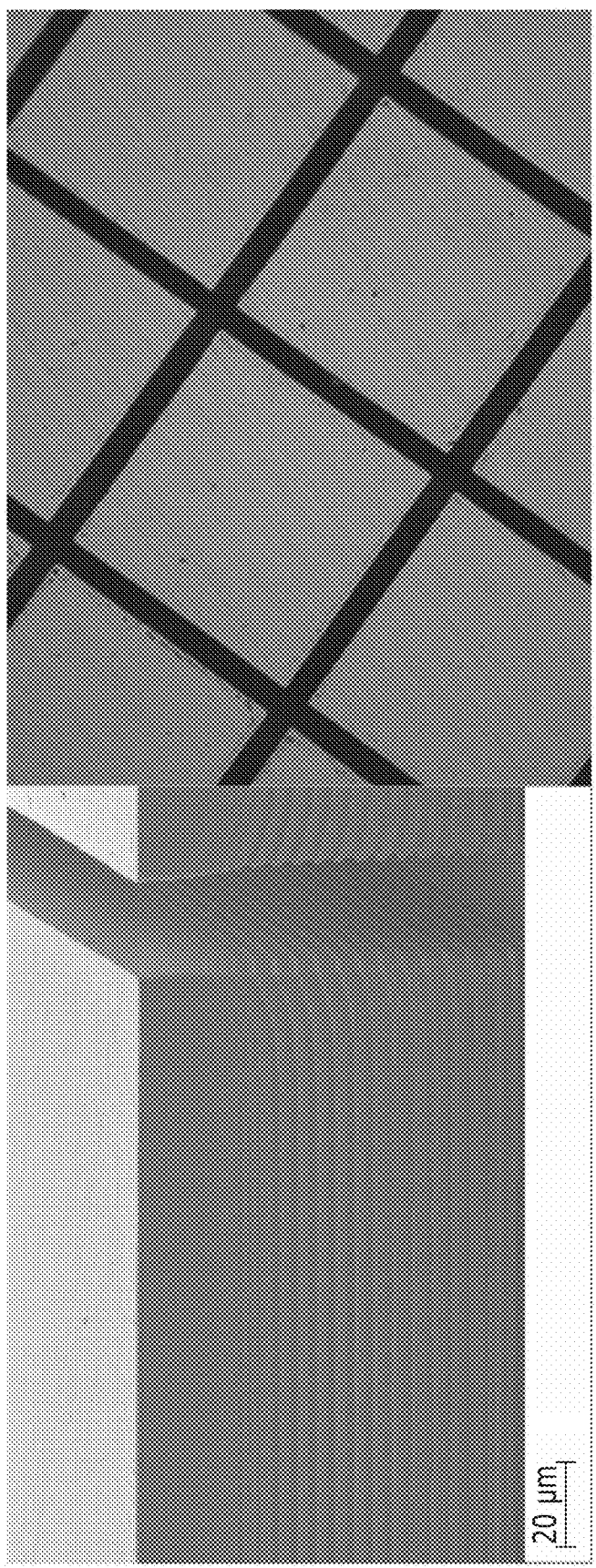
FIG. 7 shows images of dies that have been separated after performing the method of the first embodiment.

FIG. 7 shows an SEM image and an optical microscope image of dies that have been separated after performing the method of the first embodiment. In FIG. 7, the dies are orientated such that the BSM layer is on top. The silicon substrate is about 100 μm thick. The BSM is 0.370 μm thick and consists of 20 nm of Ti, 50 nm of Ni and 300 nm of Au. The amount of silicon removed in one etch step during the secondary etch was about a third of the amount of silicon removed in one etch step during the main etch. The etch time of one etch during the secondary etch was about a third of the etch time of one etch during the main etch. The switch from the main etch to the secondary etch occurred with about 30 μm of silicon remaining (i.e. about 30 μm away from the interface between the silicon and the backside metal layer). The transition steps between the main and secondary etch process consumed approximately 10 μm of Si. The figure shows that there are no metal residues adhering to the edges of the base of the die, which indicates that the BSM layer has separated very cleanly along the dicing lanes.

Figure 8:
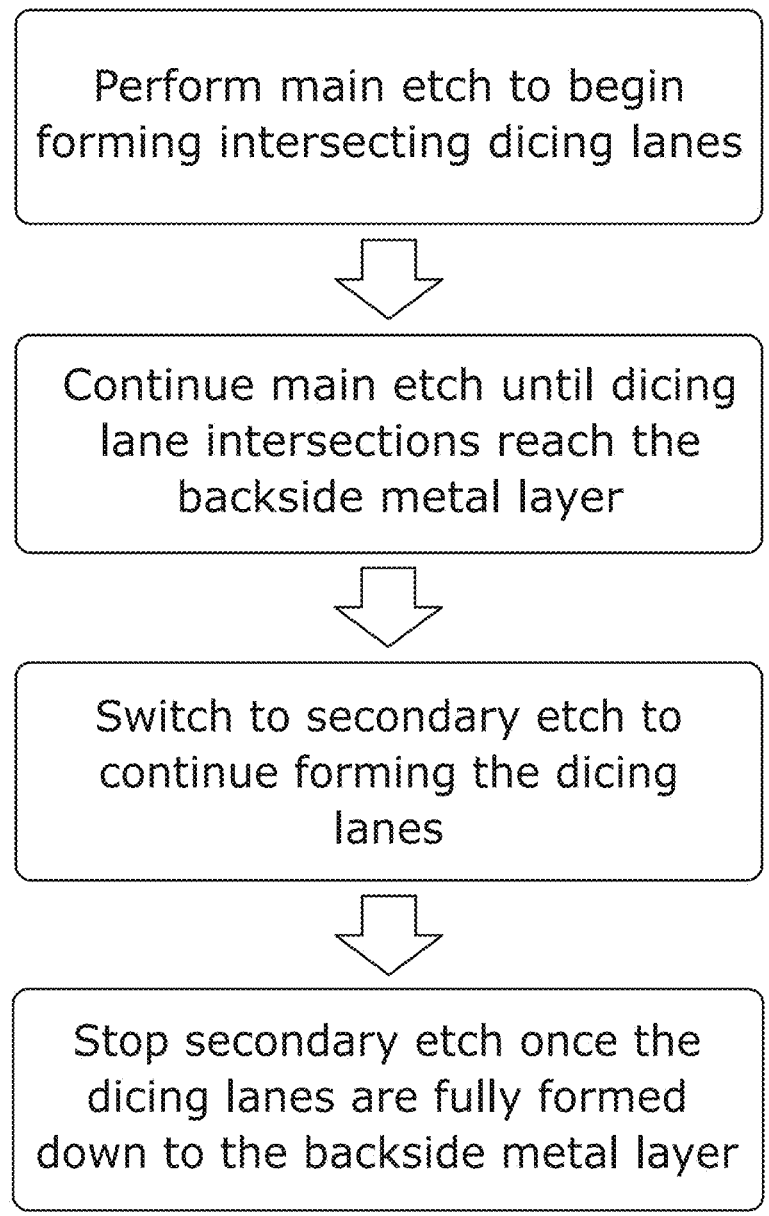
FIG. 8 shows a flowchart of a method according to a second embodiment.

FIG. 8 shows a flowchart of a method according to a second embodiment. The second embodiment is the same as the first embodiment, except that the method of the second embodiment switches to the secondary etch process when the intersections of the dicing lanes reach the BSM layer. As mentioned in the background section, the lane intersections are typically etched with different etch rates than the remaining portions of the lanes due to ARDE. Thus, at the point at which the lane intersections reach the BSM layer, the remaining portions of the dicing lanes have not yet reached the BSM layer. The secondary etch is used to complete the dicing lanes until the remaining portions of the dicing lanes reach the BSM layer.

The point at which the lane intersections reach the BSM layer can be detected using known methods, such as optical emission spectroscopy (OES) or interferometry.

The method of the second embodiment may allow a higher throughput than the method of the first embodiment because the main etch process can be performed for longer before switching to the (slower) secondary etch process. Furthermore, as mentioned above, the point at which the dicing lane intersections reach the BSM layer can be detected using known methods, thereby providing a convenient, detectable point at which the secondary etch can begin.

Figure 9:
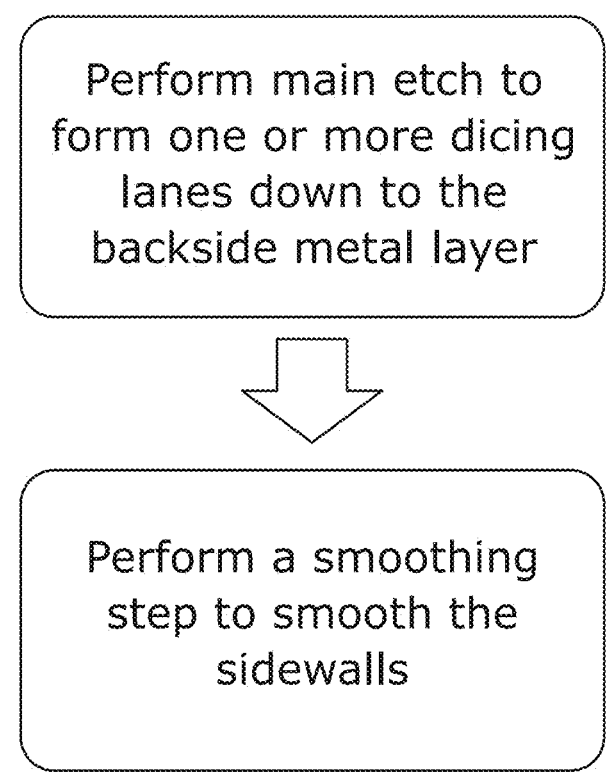
FIG. 9 shows a flowchart of a method according to a third embodiment.

FIG. 9 shows a flowchart of a method according to a third embodiment.

In the method of the third embodiment, a silicon substrate 104 having a backside metal (BSM) layer 106 attached thereto is first subjected to a main etch process. The main etch process is the same as that described for the first and second embodiments, except that the main etch process is performed until the dicing lanes reach the BSM layer. The end point can be determined using known methods, such as optical emission spectroscopy (OES) or interferometry.

Next, a smoothing step is performed to reduce the scalloping of the sidewalls, e.g. by removing the tips of the scallops. The smoothing step may be performed using an anisotropic plasma etch using a plasma formed from a suitable etching gas or gas mixture, such as a fluorine containing gas, for example $SF_6$. The gas mixture may comprise a fluorine containing gas, e.g. $SF_6$, and an inert gas, e.g. argon. Example process conditions for the smoothing step using a gas mixture of $SF_6$ and argon are indicated in Table 2.

TABLE 2

| Process parameter | Smoothing etch |
| --- | --- |
| Time [sec] | 5-150 |
| Pressure [mTorr] | 1-300 |
| RF Power [W] | 4000 |
| Bias Power [W] | 500-1000 |
| Ar [sccm] | 200-400 |
| $SF_6$ [sccm] | 100-200 |

The smoothing step of the third embodiment is highly directional and is intended to remove sharp edges to facilitate clean BSM separation.

Figure 10:
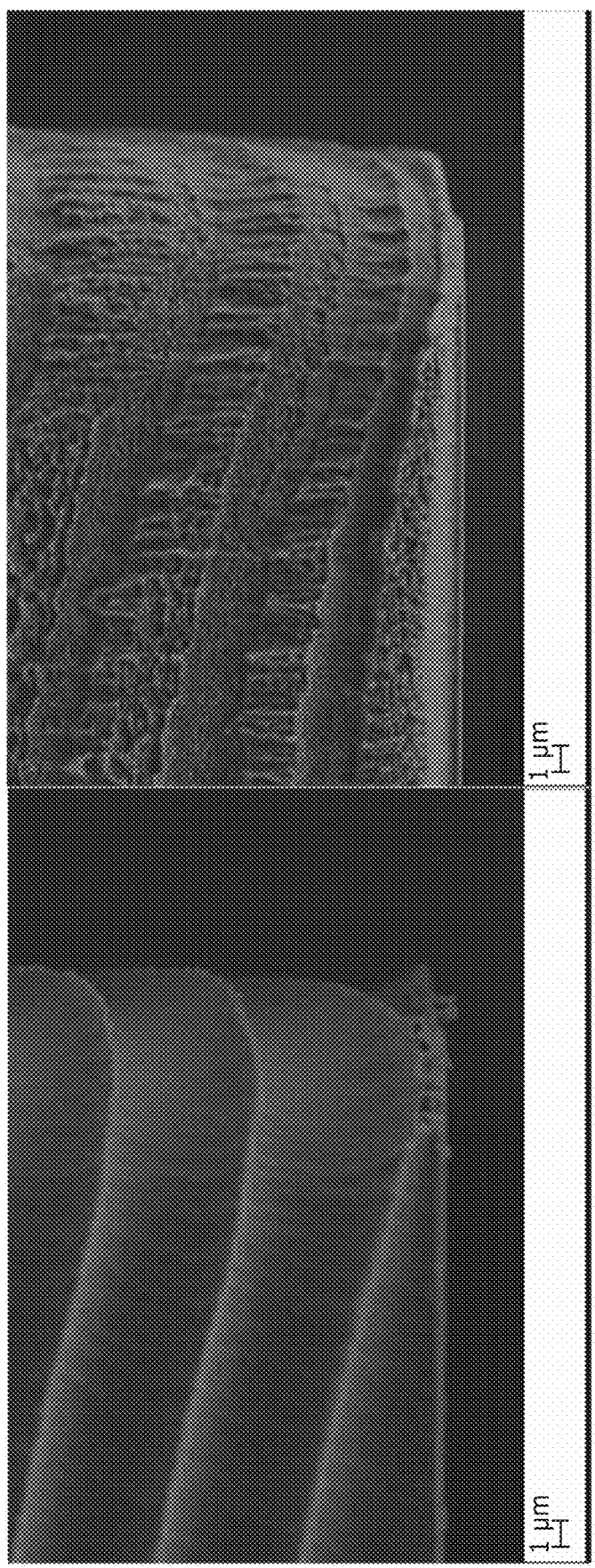
FIG. 10 shows an image of a typical scalloped feature before a smoothing step and an image of the feature after a smoothing step.

FIG. 10 shows an SEM image of a typical scalloped feature before the smoothing step and an SEM image of the feature after the smoothing step. By performing the smoothing step, irregular edges at the silicon/BSM layer interface are smoothed out, thereby providing a straighter, more regular edge at the interface to facilitate BSM separation.

The smoothing step can also be combined with the first and second embodiments by performing the smoothing step after the secondary etch. This combines the advantageous effect of smaller and shallower scallops at the interface, together with a straighter and more regular edge at the silicon/BSM layer interface.

What is claimed is:

1. A method of plasma etching one or more dicing lanes in a silicon substrate having a backside metal layer attached thereto, the method comprising the steps of:
   performing a main etch using a cyclical plasma etch process in which a deposition step and an etch step are alternately repeated to produce dicing lanes having scalloped sidewalls; and
   switching to performing a secondary etch using a cyclical plasma etch process in which a deposition step and an etch step are alternately repeated until the backside metal layer is reached;
   wherein the amount of silicon removed in one etch step during the secondary etch is half or less than half of the amount of silicon removed in one etch step during the main etch.

2. The method according to claim 1, wherein the amount of silicon removed in one etch step during the secondary etch is at least one fortieth of the amount of silicon removed in one etch step during the main etch.

3. The method according to claim 1, wherein the etch time of one etch step during the secondary etch is half or less than half of the etch time for one etch step during the main etch.

4. The method according to claim 1, wherein the etch time of one etch step during the secondary etch is at least one fortieth the etch time of one etch step during the main etch.

5. The method according to claim 1, wherein between the main etch and the secondary etch, the amount of silicon removed during each etch step is progressively reduced.

6. The method according to claim 1, wherein between the main etch and the secondary etch, the etch time of each etch step is progressively reduced.

7. The method according to claim 1, wherein the etch time of one etch step during the secondary etch is 1.5 seconds or less, preferably 1 second or less.

8. The method according to claim 1, wherein the secondary etch begins before the main etch reaches the backside metal layer.

9. The method according to claim 8, wherein the secondary etch begins when the main etch reaches a distance of about 60 μm or less from the backside metal layer.

10. The method according to claim 1, wherein a plurality of intersecting dicing lanes are to be etched, and switching to the secondary etch occurs when the dicing lane intersections reach the backside metal layer.

11. The method according to claim 1 further comprising:
   after performing the secondary etch, performing a smoothing step to reduce scalloping, wherein the smoothing step comprises exposing the sidewalls of each dicing lane to an anisotropic plasma etch which at least partially etches the scallops to provide smoothed sidewalls.

12. A method according to claim 11 in which the anisotropic plasma etch uses a plasma generated with fluorine-containing gas.

13. A method according to claim 12 in which the fluorine-containing gas is $SF_6$.

14. A method according to claim 12 in which the plasma is generated in a gaseous mixture comprising the fluorine-containing gas and an inert gas, preferably argon.

15. A method according to claim 11 in which the anisotropic plasma etch uses a RF bias having a RF power of 500 W or more.

16. A method according to claim 11 in which the anisotropic plasma etch uses a plasma generated with a RF signal having a RF power of 3000 W or more.

17. A method of plasma dicing a silicon substrate having a backside metal layer attached thereto, the method comprising:
   performing the method of plasma etching of claim 1; and
   singulating the substrate into one or more dies along the dicing lanes.

18. A method of plasma etching one or more dicing lanes in a silicon substrate having a backside metal layer attached thereto, the method comprising the steps of:
   performing a main etch using a cyclical plasma etch process in which a deposition step and an etch step are alternately repeated until the backside metal layer is reached, the main etch producing scalloped sidewalls;
   performing a smoothing step to reduce scalloping, wherein the smoothing step comprises exposing the sidewalls of each dicing lane to an anisotropic plasma etch which at least partially etches the scallops to provide smoothed sidewalls.

* * * * *